United States Patent
Ono et al.

[11] Patent Number: 6,148,044
[45] Date of Patent: Nov. 14, 2000

[54] CORRELATING FILTER AND CDMA RECEIVER

[75] Inventors: Hiroko Ono; Masatoshi Takada; Kenzo Urabe, all of Tokyo, Japan

[73] Assignee: Kokusai Electric Co., Ltd., Tokyo, Japan

[21] Appl. No.: 08/783,093

[22] Filed: Jan. 14, 1997

[30] Foreign Application Priority Data

Jan. 16, 1996 [JP] Japan .................................. 8-005235

[51] Int. Cl.⁷ .................................................. H03D 1/00
[52] U.S. Cl. .......................................... 375/343; 375/350
[58] Field of Search ........................... 364/224.19, 724.2, 364/728.03; 325/343, 305, 350, 233; 370/484; 343/100; 375/200, 232, 343, 350

[56] References Cited

U.S. PATENT DOCUMENTS

| | | | |
|---|---|---|---|
| 4,217,586 | 8/1980 | McGuffin | 342/380 |
| 5,151,919 | 9/1992 | Dent | 375/1 |
| 5,574,747 | 11/1996 | Lomp | 375/200 |

*Primary Examiner*—Huy D. Vu
*Assistant Examiner*—Alexander Boakye
*Attorney, Agent, or Firm*—Jacobson, Price, Holman & Stern, PLLC

[57] ABSTRACT

A correlating filter includes a delay circuit which outputs a plurality of tap output signals TP1 to TPn having different delays. The correlating filter further includes a weighted adder circuit which weights the tap output signals, respectively, and adds the weighted tap output signals so as to derive a correlated output signal. A timing control circuit produces a control signal based on the correlated output signal from the weighted adder circuit. The control signal is high in level when the correlated output signal has a correlation peak. A power feed to the weighted adder circuit is achieved via a switching element. The switching element is only turned on when the control signal is high in level so as to enable the power feed to the weighted adder circuit. Thus, reduction in power consumption is achieved and the filter can be used in a portable radio device.

12 Claims, 14 Drawing Sheets

CORRELATING FILTER AND CDMA RECEIVER

BACKGROUND OF THE INVENTION

1. Field of the Invention

The present invention relates to a correlating filter for use in a receiver for the code division multiple access (CDMA) communication using the spectrum spread communication, and a CDMA receiver, and in particular, to a correlating filter and a CDMA receiver for improving the power consumption.

2. Description of the Related Art

In the CDMA communication system using the spectrum spread communication, the spectrum utilization is largely improved as compared with frequency division multiple access (FDMA) communication systems or time division multiple access (TDMA) communication systems. For this reason, various practical techniques have been recently proposed.

In a communication device, particularly a receiver, for despreading communication, a correlating filter is used at times for an despreading process relative to a received signal.

For example, FIG. 7 shows a schematic structure of a conventional receiver. In this receiver, a correlation process is applied to a received signal by a correlating filter 20 and then a decoding process is applied by a decoding circuit 21 to a correlated output signal where a correlation of a given condition is achieved, so that a decoded received signal is obtained.

As a processing method achieved by the correlating filter of this kind, there have been a method where a correlation process is performed in an intermediate frequency band using a correlating filter including a SAW device and a method where a correlating filter is used for processing a base band signal after orthogonal detection.

Hereinbelow, the correlating filter for processing the base band signal after the orthogonal detection will be explained.

FIG. 6 shows a schematic structure of a correlating filter of this kind. As shown in the figure, the correlating filter includes a delay circuit 22 and a weighted adder circuit 23.

The correlating filter is provided, for example, before the decoding circuit 21 as shown in FIG. 7 so as to achieve a correlation relative to a base band signal.

FIG. 6, the delay circuit 22 is provided for outputting delayed signals relative to an input signal. When the input signal is a digital signal, the delay circuit 22 is constituted by, for example, a shift register. On the other hand, when the input signal is an analog signal, the delay circuit 22 is constituted by, for example, delay lines and an analog shift register.

FIG. 9 shows a known structure of an analog shift register. In FIG. 9, a plurality of sample hold circuits 24 having the same structure are coupled in cascade connection to each other, and each sample hold circuit is arranged to produce a delayed output.

FIG. 10 shows a known structure of the sample hold circuit 24. As shown in FIG. 10, the sample hold circuit 24 includes switches 25a and 25b which are turned on and off synchronously with a clock signal (CK), buffer circuits 26a to 26c coupled in cascade connection to each other via the switches 25a and 25b, and capacitors 27a and 27b connected to input terminals of the buffer circuits 26b and 26c, respectively.

An operation of the thus arranged sample hold circuit will be briefly explained with reference to a timing chart shown in FIG. 11. The switches 25a and 25b are turned on at a leading edge (from low level to high level) of the clock signal and turned off at a trailing edge (from high level to low level) of the clock signal.

When a signal Sin inputted to the buffer circuit 26a repeats gradual increase and gradual decrease in signal level with a lapse of time as shown at (b) in FIG. 11, a signal variation appearing at an output point (point A in FIG. 10) of the buffer circuit 26b becomes as shown at (c) in FIG. 11 since the so-called integrated output is obtained.

Since the output signal of the buffer circuit 26b is stored at the capacitor 27b via the switch 25b and outputted via the buffer circuit 26c, an output signal Sout becomes a stepwise sampled signal as shown at (d) in FIG. 11.

FIG. 12 shows a known structure of the buffer circuit 26a to 26c, wherein a so-called voltage follower including an operational amplifier 28 is used.

FIG. 13 shows another known structure of the buffer circuit 26a to 26c. In FIG. 13, a signal Sin is inputted to an inverted input terminal of an operational amplifier 28 via an impedance element 29a, and a feedback impedance element 29b is connected between the inverted input terminal and an output terminal of the operational amplifier 28 so as to form a so-called inverting amplifier.

FIG. 14 shows a known structure of the weighted adder circuit 23 (see FIG. 6). In FIG. 14, the weighted adder circuit 23 includes a plurality of weighting circuits 30 provided corresponding to tap outputs TP1 to TPn from the delay circuit 22 (see FIG. 6) and performing multiplication between the tap outputs TP1 to TPn and weighting coefficients W1 to Wn, and an adder circuit 31 which synthesizes output signals from the respective weighting circuits 30 to produce a correlated output signal.

When using a digital signal, it is preferable to constitute the weighting circuit 30 by a digital multiplier. On the other hand, when using an analog signal, it is preferable to constitute the weighting circuit 30 mainly by an operational amplifier 28 as shown in FIG. 15.

In FIG. 15, the weighting circuit includes a plurality of impedance elements 32a provided corresponding to bits of a weighting coefficient in binary notation and a plurality of switches 33 provided corresponding to bits of a weighting coefficient in binary notation same as the impedance elements 32a. Between an input terminal of the weighting circuit and an inverted input terminal of an operational amplifier 28, each of the impedance elements 32a and the corresponding switch 33 are connected in series while these series circuits are connected in parallel to each other.

A non-inverted input terminal of the operational amplifier 28 is grounded, while a feedback impedance element 32b is connected between the inverted input terminal and an output terminal of the operational amplifier 28, so that an inverted amplification is achieved.

ON/OFF states of the switches 33 are controlled corresponding to binary digits of the weighting coefficient. Assuming that the switch 33 located at the uppermost portion in FIG. 15 corresponds to the most significant bit of the weighting coefficient in binary notation, values of the impedance elements 32a are so set as to increase in order from the uppermost toward the lower impedance elements 32a. In other words, a value of the impedance element 32a connected to the switch 33 corresponding to the most significant bit is set to be minimum.

Accordingly, through ON/OFF operations of the switches 33 corresponding to the weighting coefficient, a value of impedance at the inverted input terminal of the operational amplifier 28 is changed. When capacitors are used as the impedance elements 32a and the feedback impedance element 32b, a gain G of the whole circuit is given by:

$$G = Ci/Cf$$

wherein Ci (i=1 to n) represents a capacitance of each capacitor as the impedance element 32a, and Cf represents a capacitance of the capacitor as the feedback impedance element 32b.

Thus, an input signal TPin is weighted by the sum of the impedance elements 32a depending on the ON/OFF states of the switches 33 and, after amplification, outputted as a weighted output signal Eout.

The adder circuit 31 (see FIG. 14) is preferably formed by a so-called digital adder when a digital signal is used. On the other hand, when using an analog signal, the adder circuit 31 is preferably formed by an analog adder as shown in FIG. 16.

In FIG. 16, the analog adder is basically formed by an inverting amplifier including an operational amplifier 28. Specifically, a plurality of signals Sin 1 to Sin n are inputted to an inverted input terminal of the operational amplifier 28 via corresponding impedance elements 34 so that the inputted signals are added and an output signal Sout corresponding to an inverted value of the sum of the inputted signals are obtained.

The correlating filter 20 (see FIG. 7) having the foregoing structure is constantly inputted with the received signal and, when the received signal has a given correlation, the correlating filter 20 outputs a correlated output signal (see α, β in FIG. 8) with a large output level and a small output time width, similar to a so-called impulse signal. Theoretically, one largest correlated output signal is produced at a given position as corresponding to α or β in FIG. 8. However, in practice, since dispersion of the correlation peak is caused, signals with smaller levels than the correlated output signal are produced in the neighborhood thereof (see FIG. 8).

The correlated output signal thus obtained is decoded in the decoding circuit 21 (see FIG. 7) so that a desired received signal is obtained.

On the other hand, the signal necessary for decoding in the decoding circuit 21 corresponds to just the portions identified by α and β in FIG. 8 where the largest correlation peaks are achieved, so that the other portions are not necessary.

In general, the constant operation of the correlating filter is only required at a particular case, such as upon initial acquisition of synchronism or upon interference level measurement.

However, the conventional correlating filter and decoding circuit are constantly set in operation so that the wasteful power consumption has been caused.

Particularly, the correlating filter for processing the base band signal after the orthogonal detection requires a relatively large number of the circuit parts as described above, so that the larger power consumption is required as compared with the other circuits. This can not be ignored particularly in a portable radio device using a battery as a power supply. Actually, such a correlating filter can not be used in the portable radio device.

On the other hand, the foregoing conventional correlating filter using the SAW device requires a far greater mounting area on a printed board as compared with TV SAW filters or other semiconductor devices, so that reduction in size is very difficult. This raises a problem since such a correlating filter is not suitable for the portable radio device, particularly, using the CDMA communication system for which various practical techniques have been recently proposed.

SUMMARY OF THE INVENTION

It is an object of the present invention to provide a correlating filter and a CDMA receiver which are of low power consumption and can be used in a portable radio device using a CDMA communication system.

According to one aspect of the present invention, a correlating filter comprises delaying means for applying a delay process to an input signal and outputting a plurality of delayed signals having different delays; weighted adder means for weighting the plurality of delayed signals from the delaying means, respectively, and adding the weighted delayed signals; and operation control means for substantially stopping calculation of the weighted adder means during a time period other than when the weighted adder means outputs an output signal having a correlation peak. The invention has been made in view of the fact that the output signal having a so-called correlation peak is outputted from the weighted adder means for a relatively short time, and a signal required at a decoding circuit connected after the correlating filter is only the output signal having the correlation peak. The operation control means substantially stops calculation of the weighted adder means during a time period other than when the weighted adder means outputs the output signal having the correlation peak. Thus, the power consumption can be reduced.

According to another aspect of the present invention, a correlating filter comprises delaying means for applying a delay process to an input signal and outputting a plurality of delayed signals having different delays; weighted adder means for weighting the plurality of delayed signals from the delaying means, respectively, and adding the weighted delayed signals; and operation control means for enabling a power feed to the weighted adder means while the weighted adder means outputs an output signal having a correlation peak. The invention has been made in view of the fact that the output signal having a so-called correlation peak is outputted from the weighted adder means for a relatively short time, and a signal required at a decoding circuit connected after the correlating filter is only the output signal having the correlation peak. The operation control means stops the power feed to the weighted adder means during a time period other than when the weighted adder means outputs the output signal having the correlation peak. Thus, the power consumption at the weighted adder means can be reduced.

According to another aspect of the present invention, a correlating filter comprises delaying means for applying a delay process to an input signal and outputting a plurality of delayed signals having different delays; weighted adder means for weighting the plurality of delayed signals from the delaying means, respectively, and adding the weighted delayed signals; and switching means for inputting the delayed signals from the delaying means into the weighted adder means while the weighted adder means outputs an output signal having a correlation peak, while, otherwise, outputting a given value to the weighted adder means instead of the delayed signals from the delaying means. The invention has been made in view of the fact that the output signal having a so-called correlation peak is outputted from the weighted adder means for a relatively short time, and a signal required at a decoding circuit connected after the correlating filter is only the output signal having the correlation peak. While the switching means outputs the given value to the weighted adder means, the output signal from the weighted adder means has no correlation output so that the power consumption required for the calculation process in the weighted adder means is reduced as compared with the case where the correlation is achieved. Thus, the power consumption can be reduced.

According to another aspect of the present invention, a correlating filter comprises delaying means for applying a delay process to an input signal and outputting a plurality of delayed signals having different delays; weighted adder means for weighting the plurality of delayed signals from the delaying means, respectively, and adding the weighted delayed signals; and switching means for inputting weighting coefficients from external into the weighted adder means while the weighted adder means outputs an output signal having a correlation peak, while, otherwise, outputting a given value to the weighted adder means instead of the weighting coefficients. The invention has been made in view of the fact that the output signal having a so-called correlation peak is outputted from the weighted adder means for a relatively short time, and a signal required at a decoding circuit connected after the correlating filter is only the output signal having the correlation peak. While the switching means outputs the given value, such as zero, to the weighted adder means, the output signal from the weighted adder means has no correlation output so that the power consumption required for the calculation process in the weighted adder means is reduced as compared with the case where the correlation is achieved. Thus, the power consumption can be reduced.

According to another aspect of the present invention, a CDMA receiver comprises each of the foregoing correlating filters and decoding means for reproducing received data from an output signal of the correlating filter, wherein the decoding means is controlled by the operation control means of the correlating filter so as to be operated at the same timing as the weighted adder means. The invention has been made in view of the fact that the output signal having a so-called correlation peak is outputted from the weighted adder means for a relatively short time, and a signal required at a decoding circuit connected after the correlating filter is only the output signal having the correlation peak. Since the decoding means is controlled by the operation control means of the correlating filter so as to be operated at the same timing as the weighted adder means, not only the weighted adder means, but also the decoding means can reduce the power consumption.

<Description of Reference Numerals>

1 . . . Delay Circuit, 2 . . . Weighted adder circuit, 3 . . . Timing control circuit, 4 . . . Switching element, 6,7 . . . Switching circuit, 8 . . . Correlating filter, 9 . . . Decoding circuit

DESCRIPTION OF THE PREFERRED EMBODIMENT

Now, preferred embodiments of the present invention will be described hereinbelow with reference to the accompanying drawings.

Elements, arrangements and others which will be described hereinbelow do not limit the present invention thereto, but can be modified within the gist of the present invention.

A correlating filter according to a first preferred embodiment of the present invention will be described hereinbelow with reference to FIG. 1.

Figure 1:
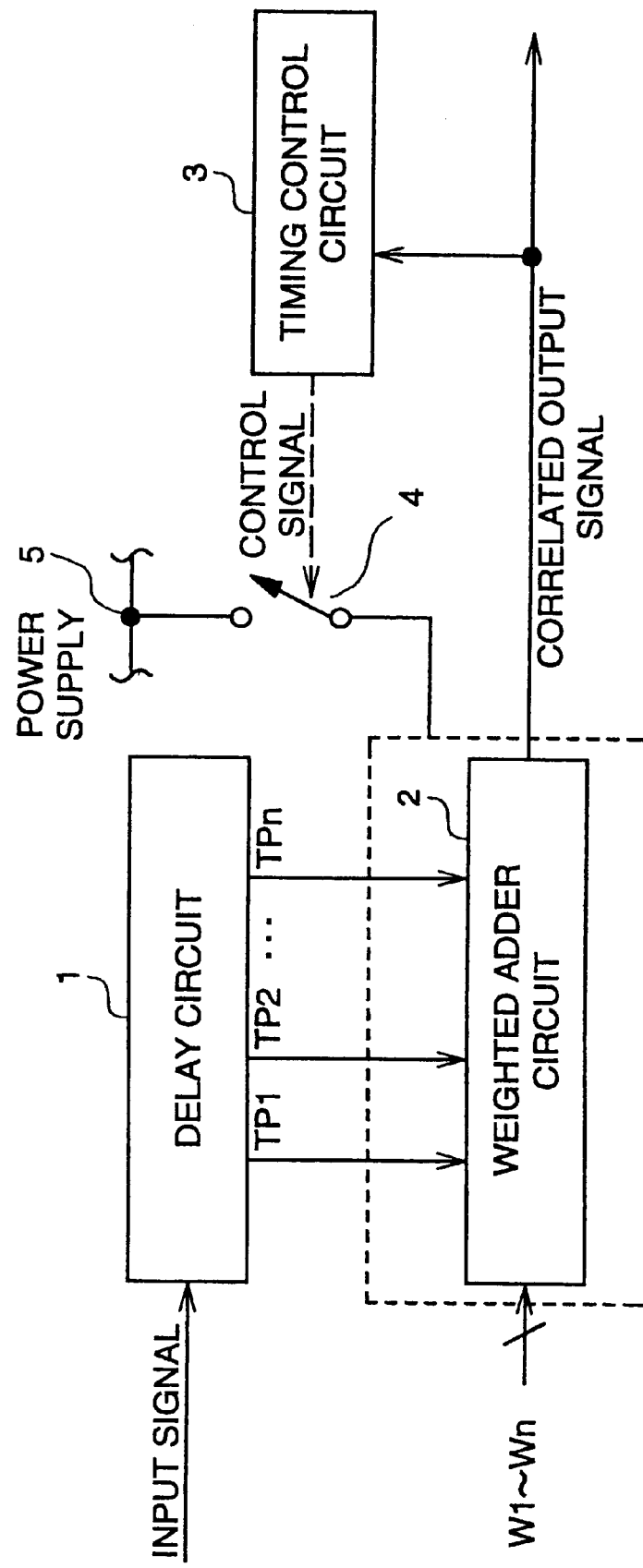
FIG. 1 is a structural diagram showing a correlating filter according to a first preferred embodiment of the present invention.

As shown in FIG. 1, the correlating filter includes a delay circuit 1, a weighted adder circuit 2, a timing control circuit 3 and a switching element 4. The delay circuit 1 and the weighted adder circuit 2 are basically the same as those of the conventional correlating filter.

The timing control circuit 3 controls an operation of the switching element 4 based on a correlated output signal obtained from the weighted adder circuit 2. In response to a control signal from the timing control circuit 3, the switching element 4 is turned on at given time intervals so as to apply the power supply voltage to the weighted adder circuit 2 from the power supply 5.

In FIG. 1, a signal inputted to the delay circuit 1 is delayed so as to be outputted as a plurality of tap output signals TP1 to TPn having different delays, and then inputted to the weighted adder circuit 2. This is the same as the prior art.

Figure 5:
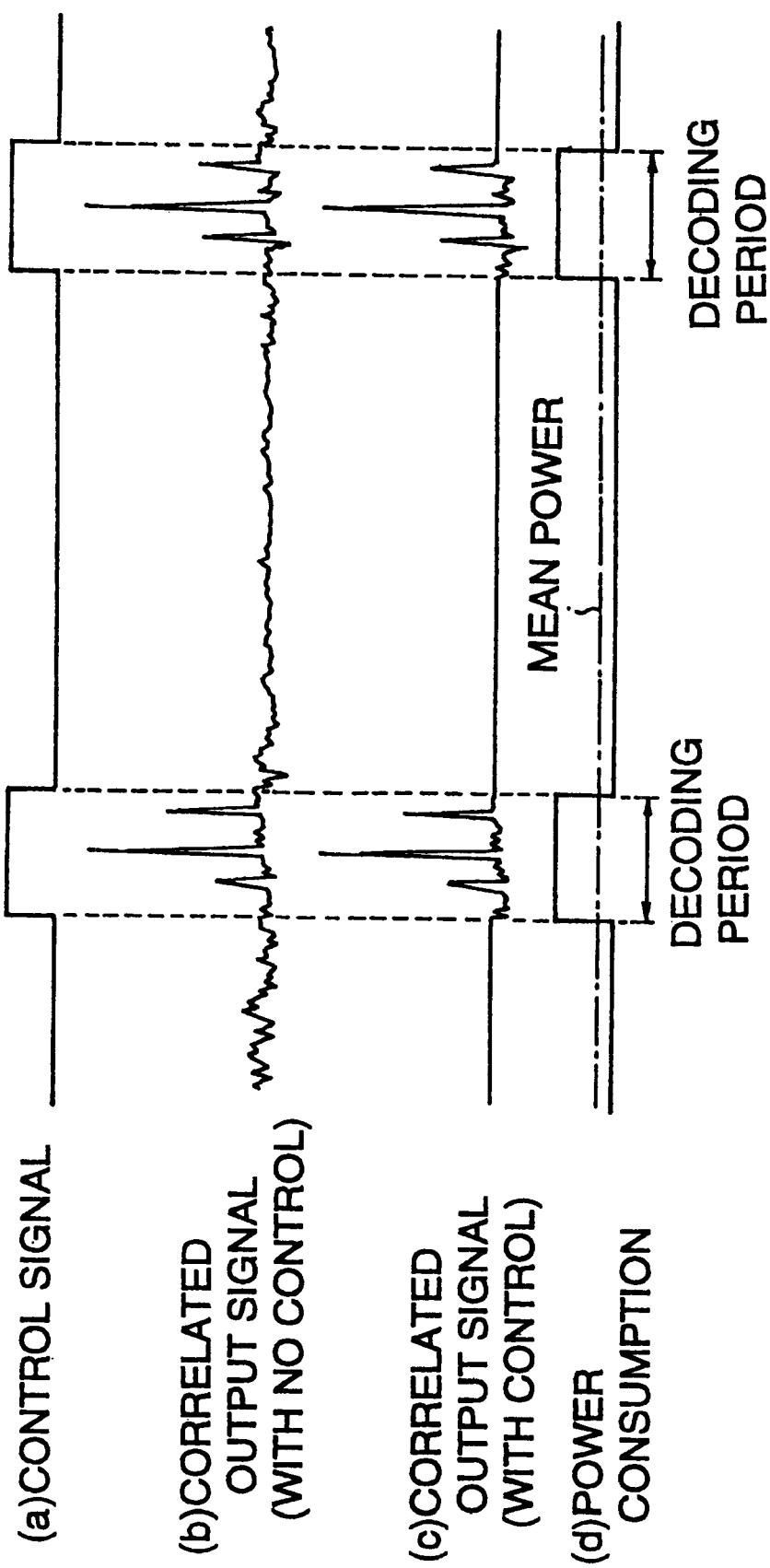
FIG. 5 is a timing chart for explaining an operation of the correlating filter according to the first preferred embodiment of the present invention.
Figure 6:
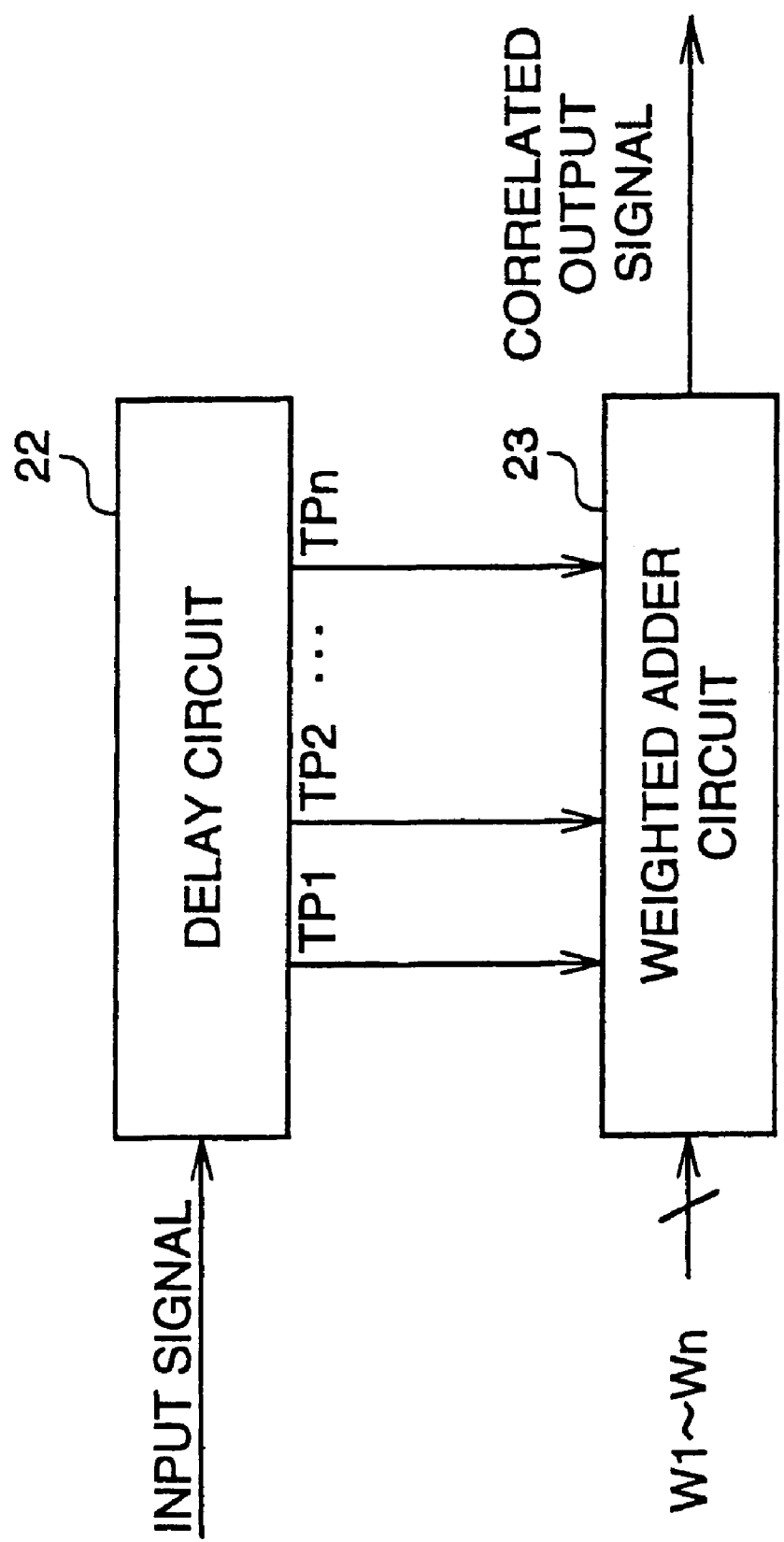
FIG. 6 is a structural diagram showing an example of a conventional correlating filter.
Figure 7:
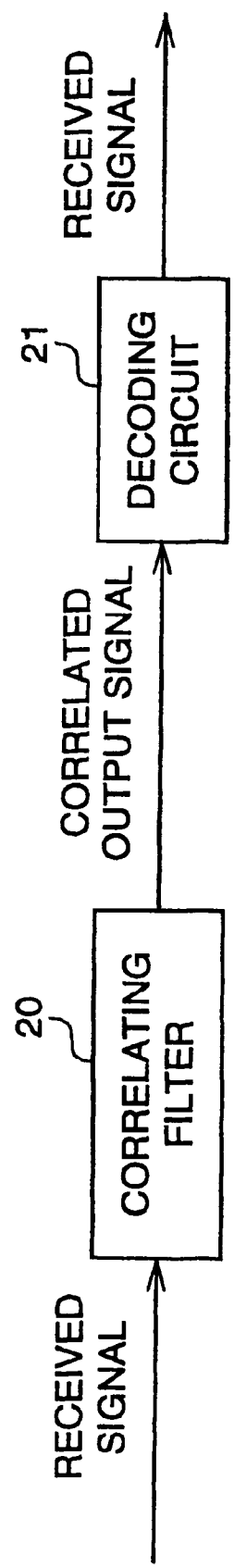
FIG. 7 is a structural diagram showing an example of a conventional CDMA receiver.
Figure 8:
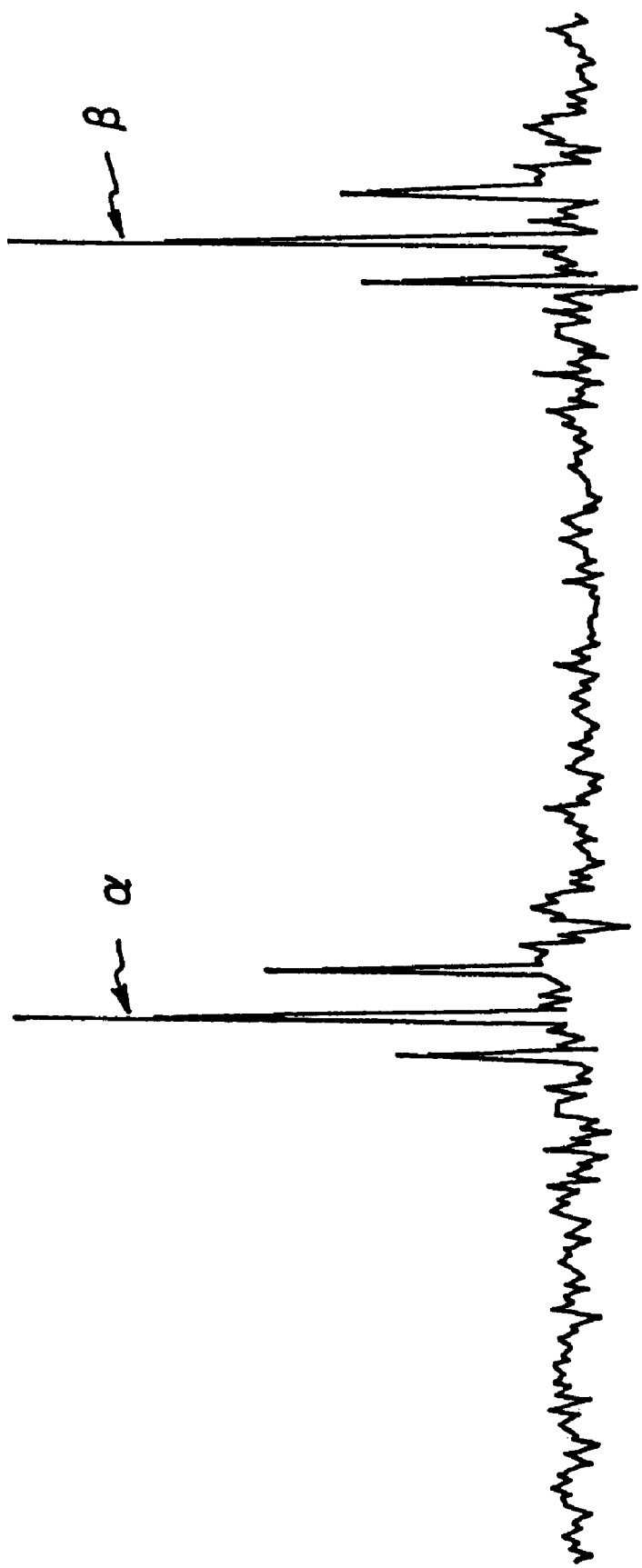
FIG. 8 is a schematic diagram for explaining a state of an output signal of a conventional correlating filter.
Figure 9:
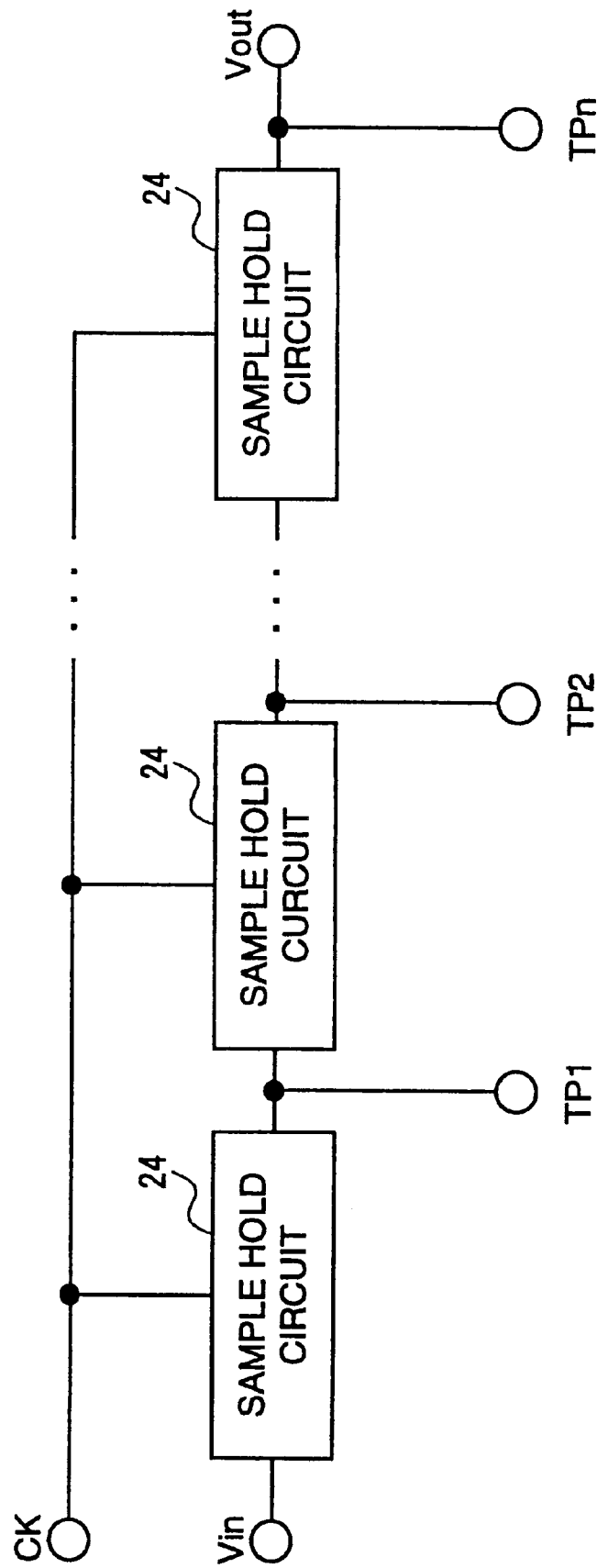
FIG. 9 is a structural diagram showing an example of a conventional delay circuit.
Figure 10:
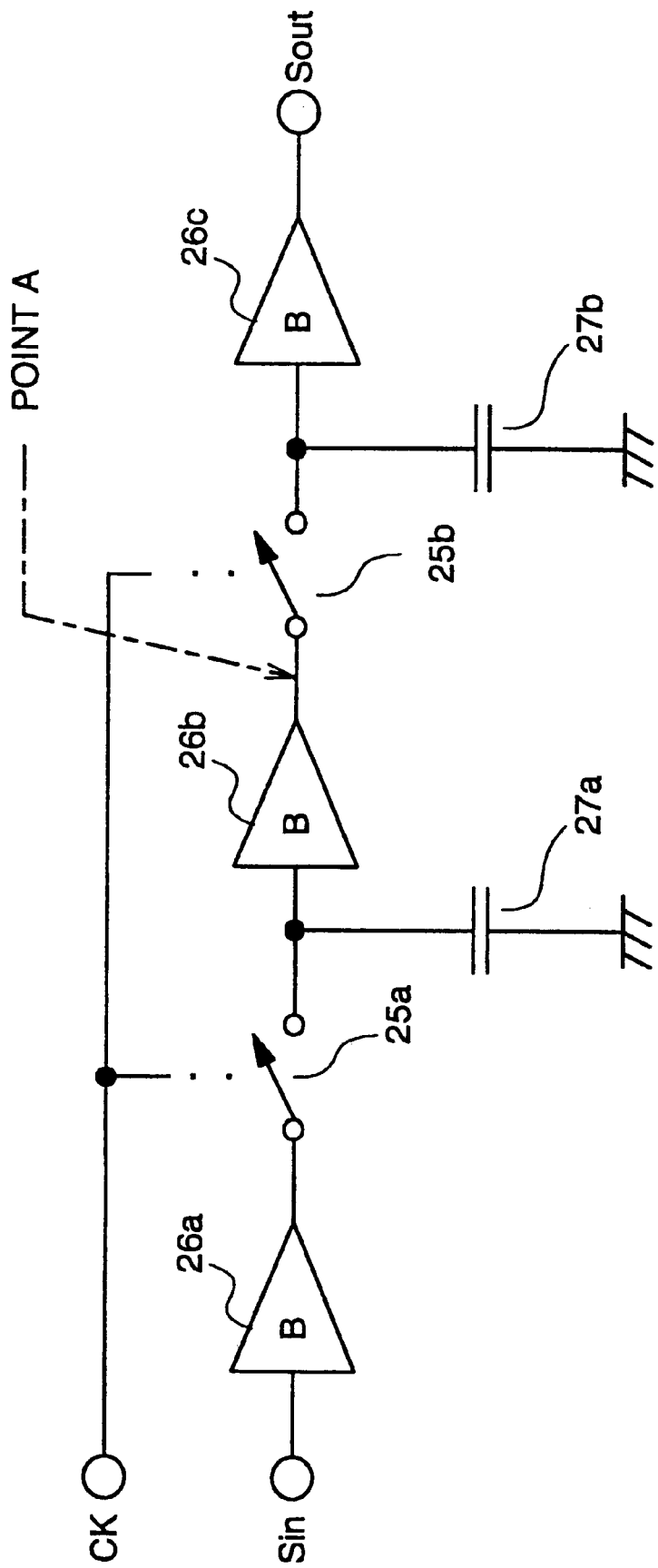
FIG. 10 is a structural diagram showing an example of a conventional sample hold circuit.
Figure 11:
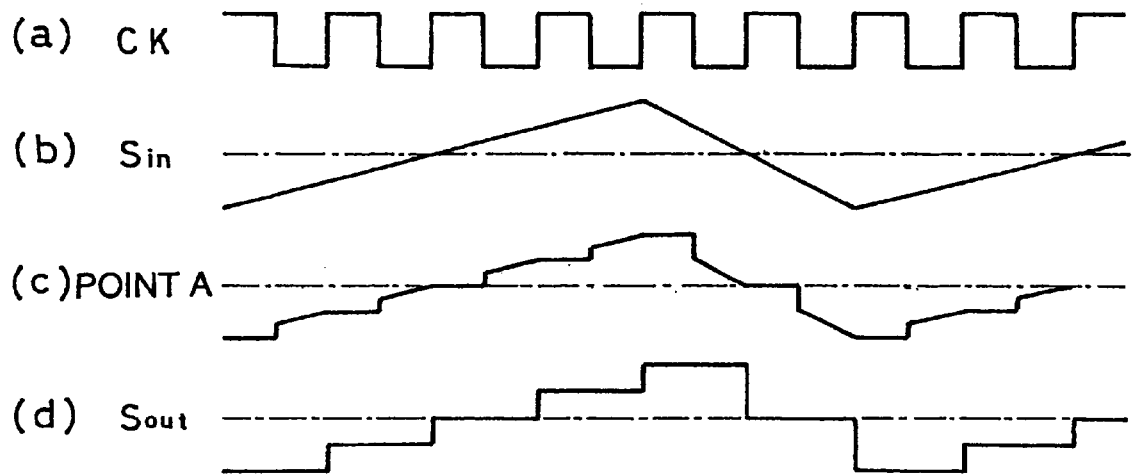
FIG. 11 is a timing chart for explaining an operation of the sample hold circuit shown in FIG. 10.
Figure 12:
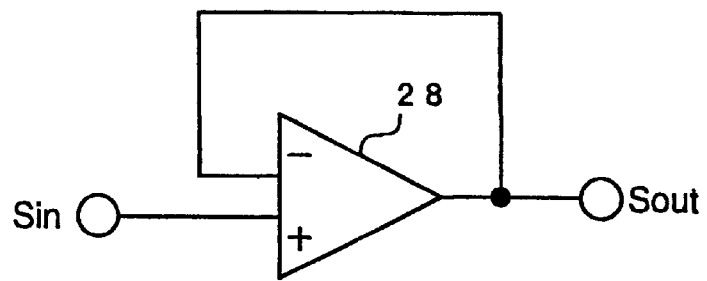
FIG. 12 is a structural diagram showing an example of a conventional buffer circuit.
Figure 13:
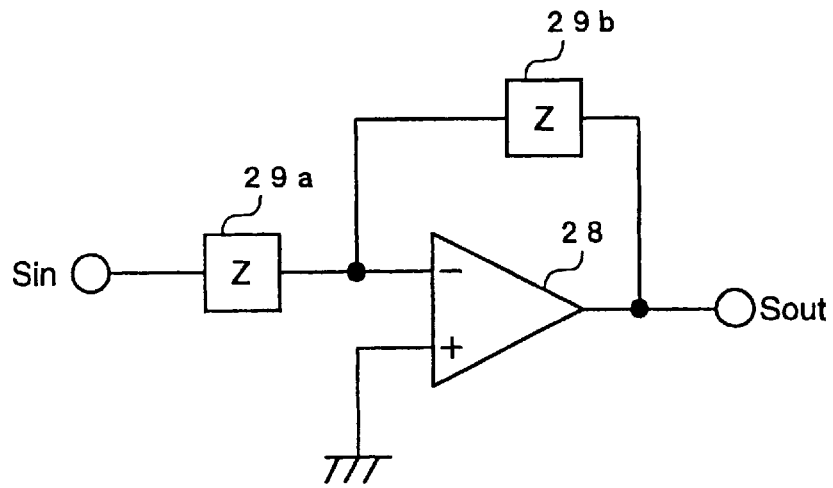
FIG. 13 is a structural diagram showing another example of a conventional buffer circuit.
Figure 14:
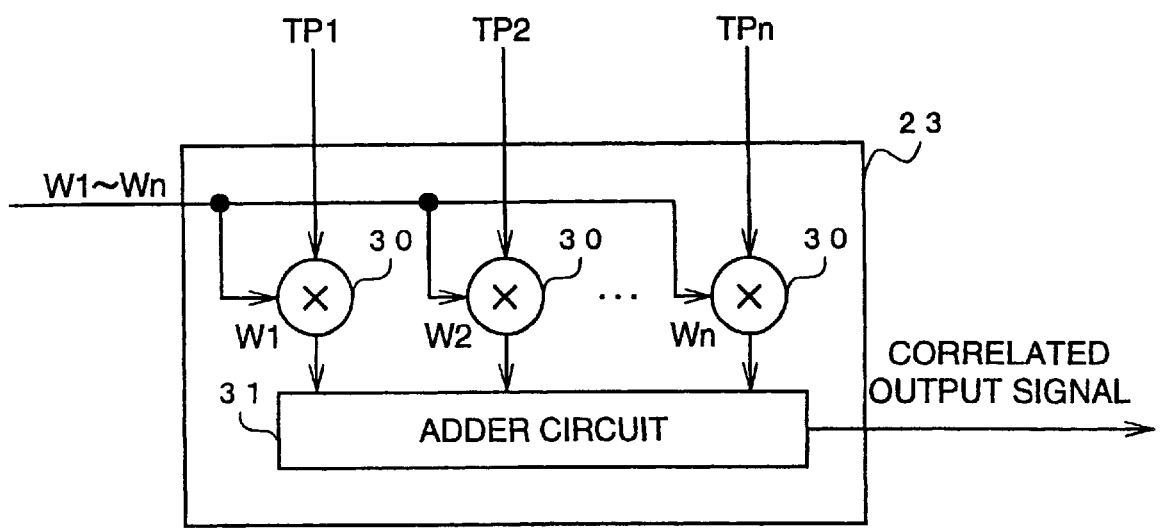
FIG. 14 is a structural diagram showing an example of a conventional weighted adder circuit.
Figure 15:
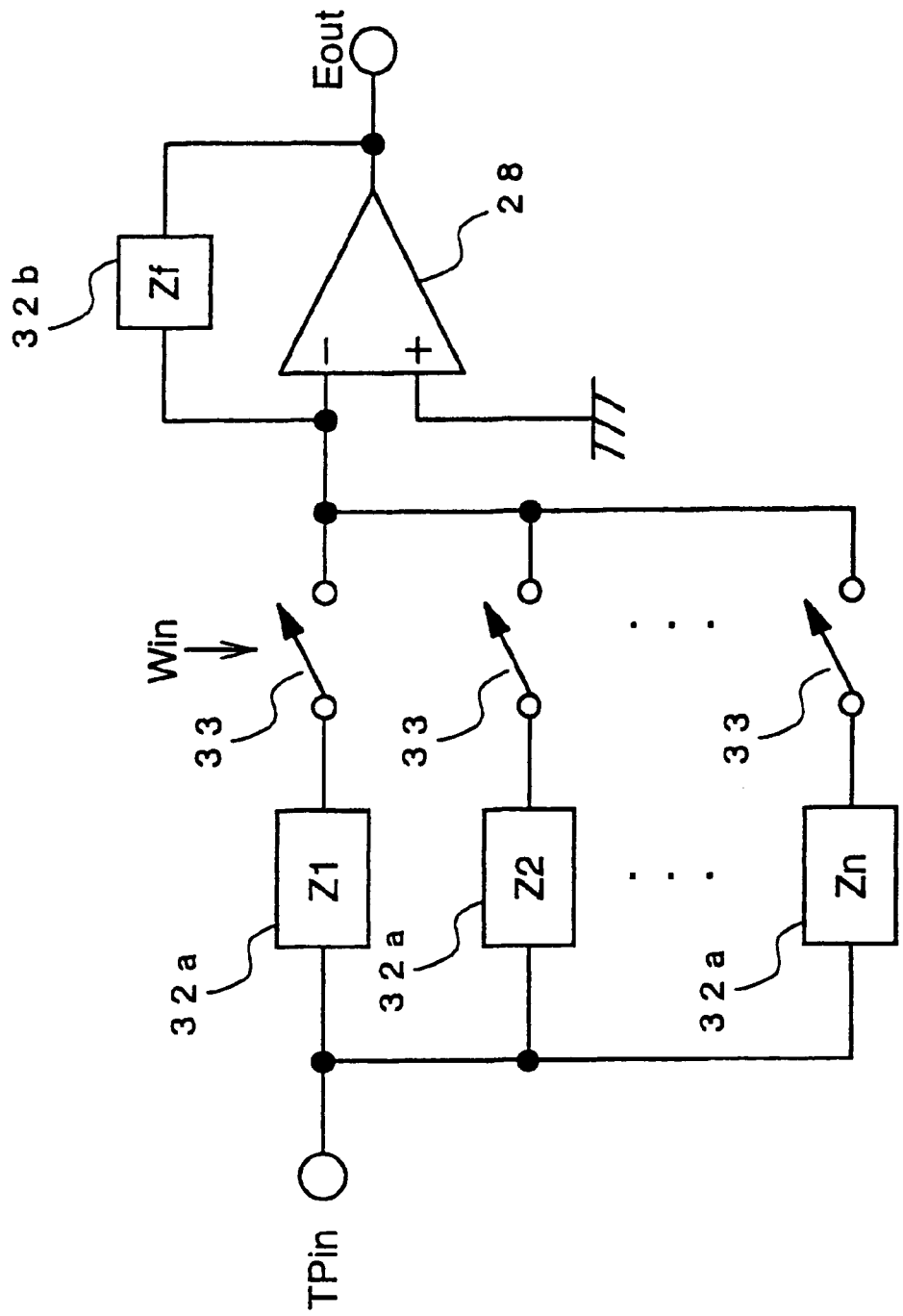
FIG. 15 is a structural diagram showing an example of a conventional weighting circuit.
Figure 16:
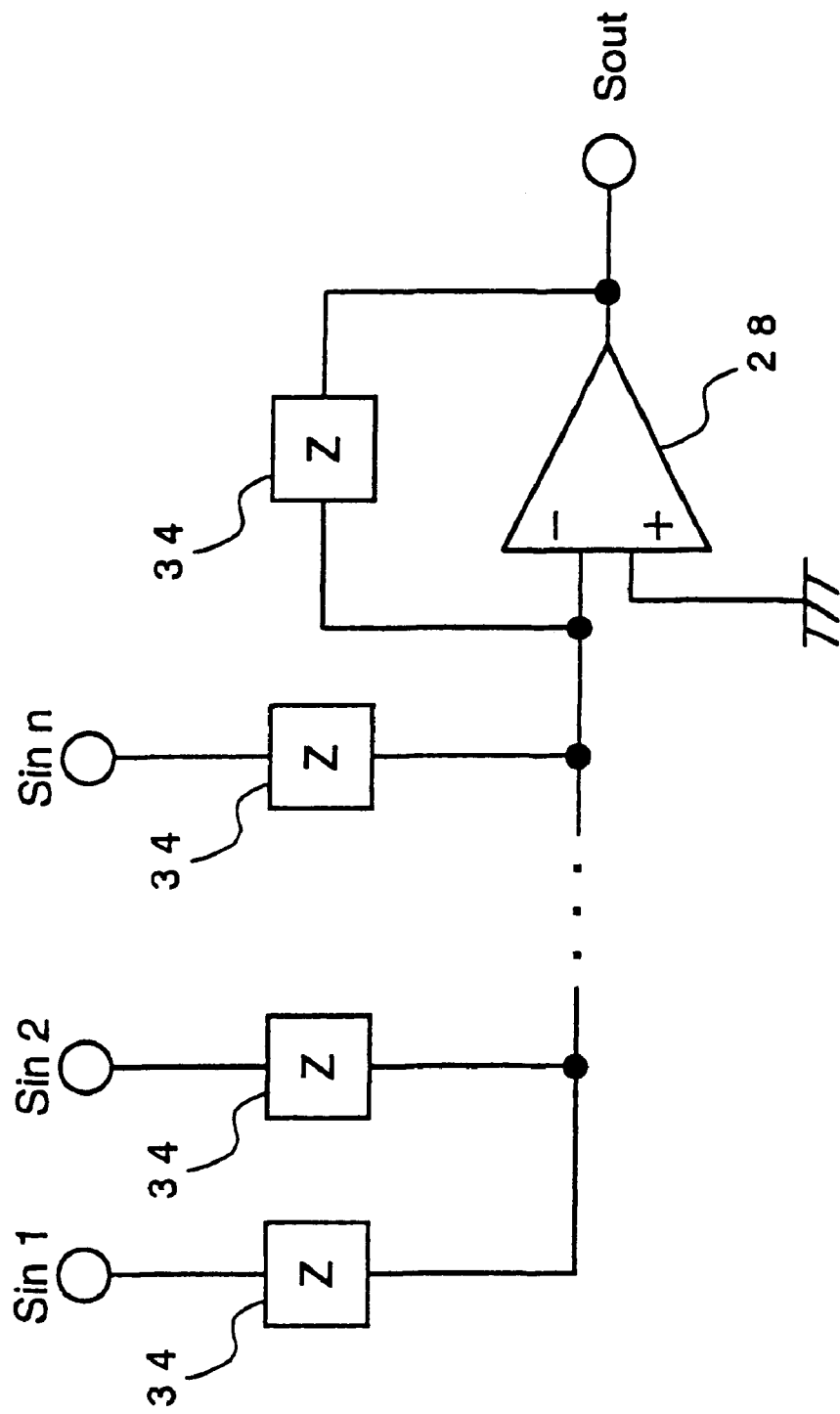
FIG. 16 is a structural diagram showing an example of a conventional synthesizing circuit.

Further, if the voltage is constantly applied to the weighted adder circuit 2 from the power supply 5, the weighted adder circuit 2 produces a correlated output signal as shown at (b) in FIG. 5, with respect to the tap output signals TP1 to TPn inputted from the delay circuit 1. This is also the same as the prior art.

In his preferred embodiment, based on the output signal from the weighed adder circuit 2, the timing control circuit 3 produces a control signal as shown, for example, at (a) in FIG. 5, which becomes high in level in a period where the largest correlation peaks are concentrated.

The switching element 4 is connected in series between a power supply section (not shown) of the weighted adder circuit 2 and the power supply 5, and turned on only when the control signal from the timing control circuit 3 (see FIG. 5(a)) is high in level. Thus, the weighted adder circuit 2 is fed with the power only during this period so as to be operated.

The timing of the control signal to become high in level is not determined in advance. Specifically, the timing control circuit 3, for example, outputs a control signal which can turn on the switching element 4 at given time intervals so as to operate the weighted adder circuit 2. Then, based on an output signal from the weighted adder circuit 2, the timing control circuit 3 determines whether the largest correlation peak appears or not, so as to finally produce the control signal as shown at (a) in FIG. 5.

Accordingly, the power consumption is not generated in the weighted adder circuit 2 during time periods other than when the switching element 4 is turned on based on the control signal. Thus, the power saving can be achieved as seen from (c) in FIG. 5.

For example, if a ratio of an ON time and an OFF time of the switching element 4 is 1:9 and a ratio of power consumption of the whole circuit including the weighted adder circuit 2 and the other circuits during the ON time and that during on the OFF time is 10:1, the mean power is represented by a ratio derived by the following equation:

$$(10 \times 1 + 9 \times 1)/(10 \times 10) = 0.19$$

Specifically, the derived value represents that the power consumption can be suppressed to 19% relative to the conventional power consumption caused by the constant power feed.

In FIG. 5 at (d), a chain line represents the mean power consumption, while a solid line represents the power consumption when the largest correlated output signal is outputted from the weighted adder circuit 2 and decoded at a decoding circuit (not shown).

In the foregoing first embodiment, the delay circuit 1 corresponds to delay means in claim 1 and 2, and the weighted adder circuit 2 corresponds to weighted adder means in claim land 2, and the timing control circuit 3 and the switching element 4 correspond to operation control means in claim 1 and 2 respectively.

Now, a correlating filter according to a second preferred embodiment of the present invention will be described hereinbelow with reference to FIG. 2.

Figure 2:
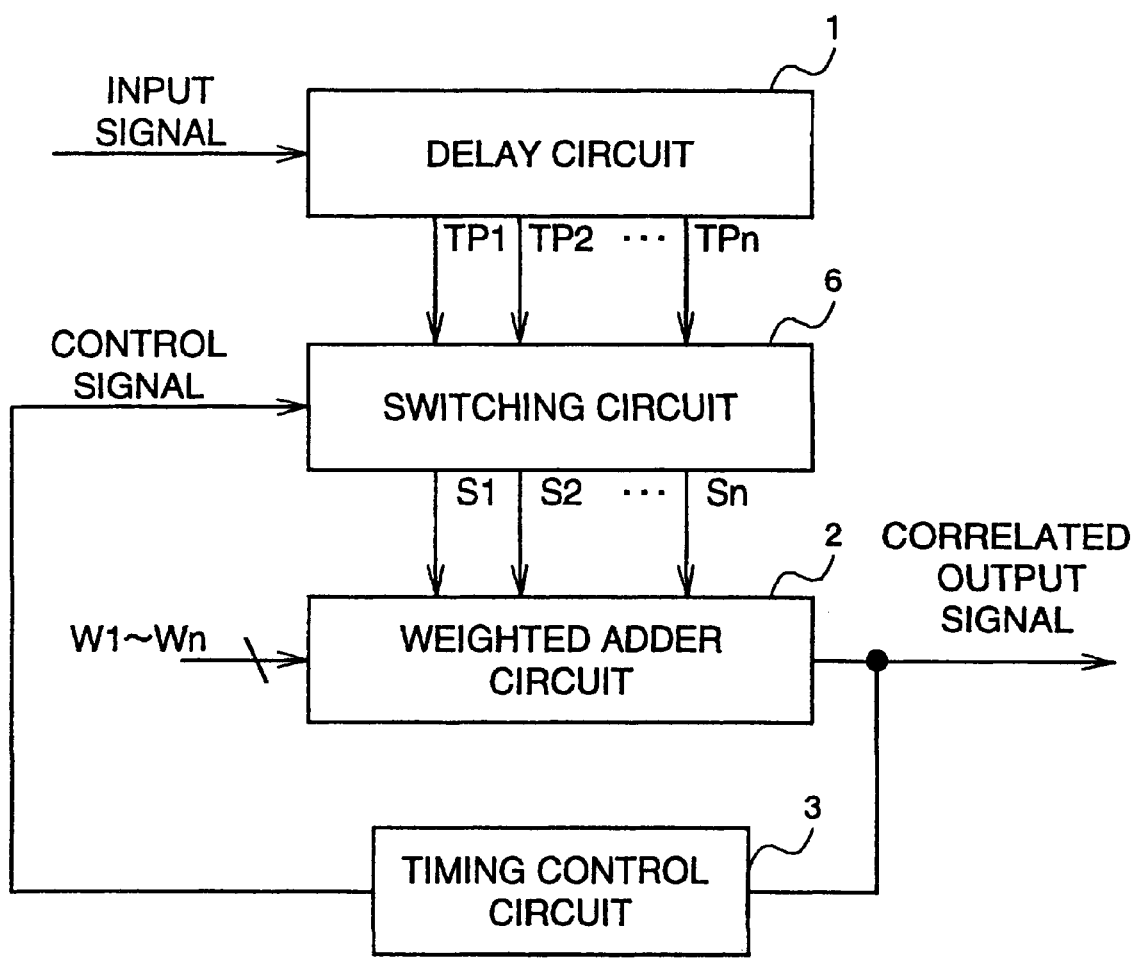
FIG. 2 is a structural diagram showing a correlating filter according to a second preferred embodiment of the present invention.

In FIG. 2, the same elements as those in FIG. 1 are assigned the same reference marks so as to omit detailed explanation thereof In the correlating filter shown in FIG. 2, a switching circuit 6 is provided between the delay circuit 1 and the weighted adder circuit 2. The switching circuit 6 is operated depending on a control signal from the timing control circuit 3.

Specifically, in response to the control signal as shown at (a) in FIG. 5 inputted from the timing control circuit 3, the switching circuit 6 outputs the tap output signals TPl to TPn from the delay circuit 1 to the weighted adder circuit 2 only when the inputted signal has a correlation peak, as shown in FIG. 1 so that the control signal is high in level, while, otherwise, the switching circuit 6 outputs a given value to the weighted adder circuit 2.

The given value outputted from the switching circuit 6 is set to be a fixed value which provides no correlation output in the correlated output signal from the weighted adder circuit 2. Accordingly, while this fixed value is inputted, the power consumption at the weighted adder circuit 2 is smaller than that when the correlation peak appears, and further approximately constant.

The switching circuit 6 can be formed by so-called gate elements, such as AND circuits or OR circuits, when handling a digital signal. On the other hand, when handling an analog signal, the switching circuit 6 can be formed by an analog switch or the like so as to switch between the output signals from the delay circuit 1 and the foregoing fixed value. In such structures, particularly, the effect in reduction of power consumption in a digital circuit using CMOS or the like is significant.

In the foregoing second embodiment, the delay circuit 1 corresponds to delay means in claim 1 and 3, and the weighted adder circuit 2 corresponds to weighted adder means in claim 1 and 3, and the timing control circuit 3 and the switching circuit 6 correspond to operation control means in claim 1 and switching means in claim 3 respectively.

Now, a correlating filter according to a third preferred embodiment of the present invention will be described hereinbelow with reference to FIG. 3.

Figure 3:
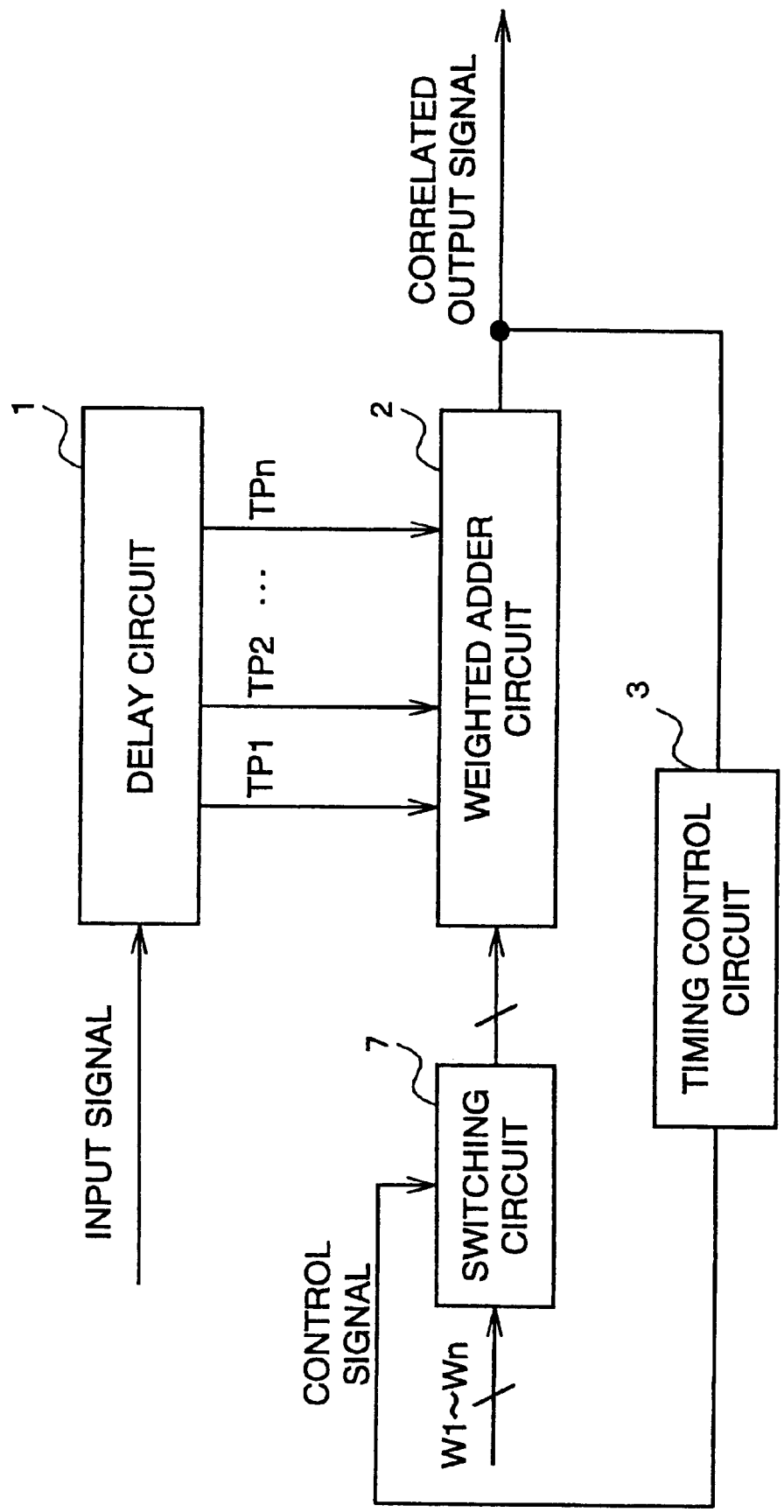
FIG. 3 is a structural diagram showing a correlating filter according to a third preferred embodiment of the present invention.

In FIG. 3, the same elements as those in FIG. 1 or 2 are assigned the same reference marks so as to omit detailed explanation thereof.

As shown in FIG. 3, the correlating filter includes the delay circuit 1 and the weighted adder circuit 2 and fierier includes a switching circuit 7 for switching the weighting coefficients used in weighted adder circuit 2 and the timing control circuit 3 for controlling an operation timing of the switching circuit 7.

The switching circuit 7 outputs the weighting coefficients W1 to Wn, inputted from the external, directly to the weighted adder circuit 2 only when the inputted signal has a correlation peak, while, otherwise, the switching circuit 7 outputs a value of zero to the weighted adder circuit 2 as the weight coefficients.

Based on correlation output signal inputted from the weighted adder circuit 2, when the inputted signal has a correlation, the timing control circuit 3, for example, outputs control signal as shown at (a) in FIG. 5. The timing control circuit 3 is basically the same as shown in FIG. 1 and 2.

In response to the control signal as shown at (a) in FIG. 5 inputted from the timing control circuit 3, the switching circuit 7 outputs the weighting coefficients W1 to Wn, inputted from the external, directly to the weighted adder circuit 2 only when the inputted signal has a correlation peak, as shown in FIG. 1 so that the control signal is high in level, while, otherwise, the switching circuit 7 outputs a value of zero to the weighted adder circuit 2 instead of the weighting coefficients W1 to Wn.

Accordingly, no correlation output is achieved at the weighted adder circuit 2 while the zero value is inputted from the switching circuit 7. Thus, the power consumption is reduced as compared with the case where the correlation is achieved.

As appreciated, since the input signals from the delay circuit 1 are changed regardless of the signals from the switching circuit 7, even if the input signal from the switching circuit 7 is zero, the weighting calculation is performed at the weighted adder circuit 2. Thus, the rate of reduction in power consumption is smaller as compared with the second preferred embodiment. However, since adding of the calculated results after the weighting calculation is not performed, the reduction in power consumption corresponding thereto is reliably achieved. Particularly, when the weighted adder circuit is constituted by a digital circuit using CMOS or the like, the effect of reduction in power consumption is significant.

In the foregoing third embodiment, the delay circuit 1 corresponds to delay means in claim 1 and 4, and the weighted adder circuit 2 corresponds to weighted adder means in claim 1and 4, and the timing control circuit 3 and the switching circuit 7 correspond to operation control means in claim 1 and switching means in claim 4 respectively.

Now, a CDMA receiver according to a fourth preferred embodiment of the present invention will be described hereinbelow with reference to FIG. 4.

Figure 4:
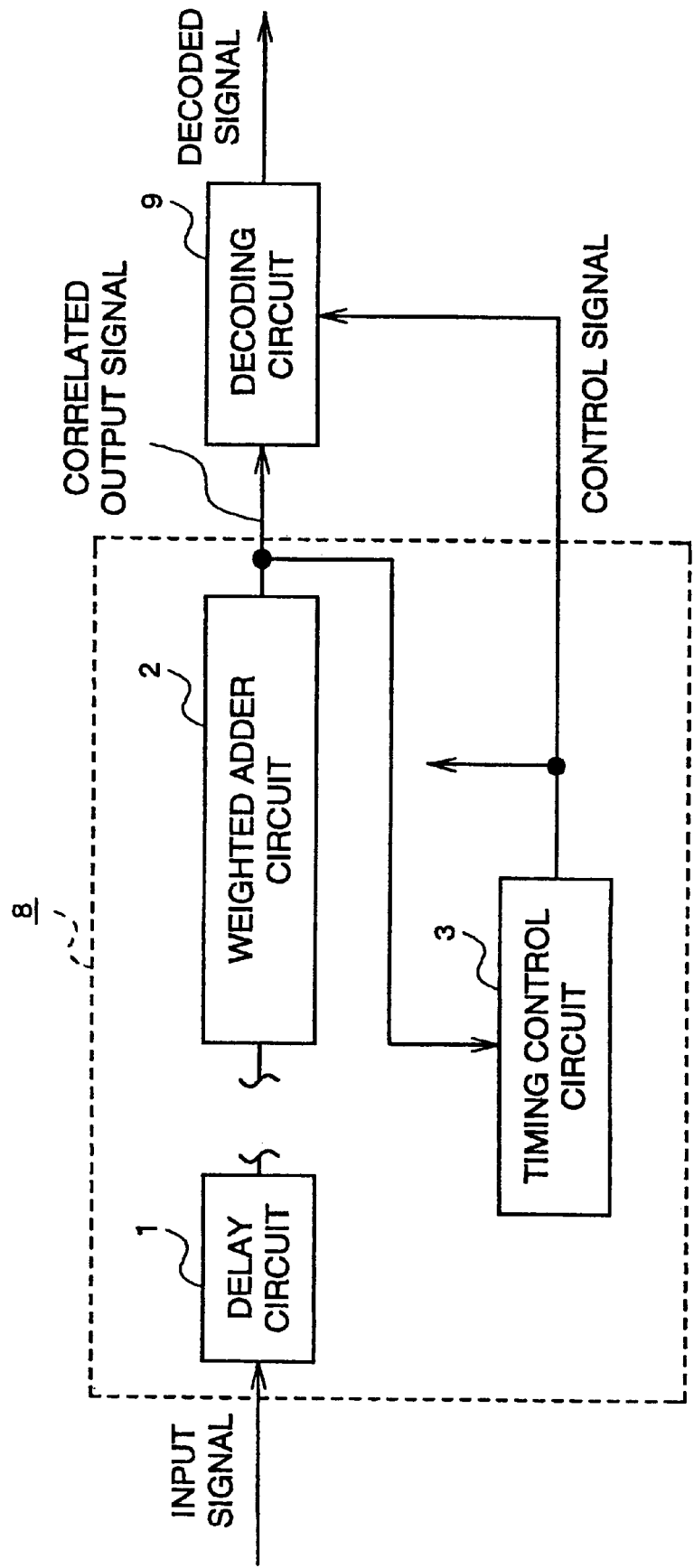
FIG. 4 is a structural diagram showing a CDMA receiver according to a preferred embodiment of the present invention.

In FIG. 4, the same elements as those in FIG. 1, 2 or 3 are assigned the same reference marks so as to omit detailed explanation thereof As shown in FIG. 4, the CDMA receiver includes a correlating filter 8 and a decoding circuit 9. The correlating filter 8 may have any one of the structures shown in FIGS. 1 to 3. In FIG. 4, the correlating filter 8 is shown to have only the three circuits (the delay circuit 1, the weighted adder circuit 2 and the timing control circuit 3) which are common to all the correlating filters shown in FIGS. 1 to 3, for simplicity.

In FIG. 4, a control signal from the timing control circuit 3 is supplied not only within the correlating filter 8, but also to the decoding circuit 9 so as to control an operation thereof.

Accordingly, in response to the control signal from the timing control circuit 3, that is, the correlating filter 8, the decoding circuit 9 is operated only when the control signal is high in level, to perform the decoding process so that a decoded signal is obtained.

Thus, the reduction in power consumption is achieved not only in the correlating filter 8, but also in the decoding circuit 9.

According to the present invention, since the calculating operation of the weighted adder means is substantially stopped during a time period where no such a calculating operation is necessary, the reduction in power consumption is achieved. Thus, as opposed to the prior art, the correlating filter which can be used in the portable device is provided.

According to the correlating filter in the first preferred embodiment of the present invention, since the power feed to the weighted adder means is performed only during a time period where the power feed is actually necessary, the power consumption which is actually not required is prevented from occurring. Thus, the reduction in power consumption is achieved and, in particular, the correlating filter which can be used in the portable device is provided.

According to the correlating filter in the second preferred embodiment of the present invention, since the weighted adder means is inputted with the constant value instead of the input signals from the delaying means during a time period where the calculating process by the weighted adder means is not necessary, the power consumption required for the calculating process in the weighted adder means is reduced. Thus, the reduction in power consumption is achieved and, in particular, the correlating filter which can be used in the portable device is provided.

According to the correlating filter in the third preferred embodiment of the present invention, since the weighted adder means is inputted with the constant value instead of the weighting coefficients from the external during a time period where the calculating process by the weighted adder means is not necessary, the power consumption required for the calculating process in the weighted adder means is reduced. Thus, the reduction in power consumption is achieved and, in particular, the correlating filter which can be used in the portable device is provided.

According to the CDMA receiver in the fourth preferred embodiment of the present invention, the reduction in power consumption in the correlating filter is achieved as described above and, in addition, since the decoding means is operated only while the signal having the correlation peak is received from the correlating filter, the reduction in power consumption is also achieved in the decoding means comparing with conventional decoding means that is constantly operated. Thus, the CDMA receiver suitable for the portable device can be provided.

What is claimed is:

1. A correlating filter comprising:

delaying means for applying a delay process to an input signal and outputting a plurality of delayed signals having different delays;

weight adder means for weighting said plurality of delayed weighted delayed signals; and operation control means for stopping calculation calculation of said weighted adder means by stopping a power feed to said weighted adder during a time period when said weighted adder means does not output an output signal having a correlation peak.

2. A correlating filter comprising:

delaying means for applying a delay process to an input signal and outputting a plurality of delayed signals having different delays;

weighted adder means for weighting said plurality of delayed signals from said delaying means, respectively, and adding the weighted delayed signals; and operation control means for enabling a power feed to said weighted adder means while said weighted adder means outputs an output signal having a correlation peak.

3. A correlating filter comprising:

delaying means for applying a delay process to an input signal and outputting a plurality of delayed signals having different delays;

weight adder means for weighting said plurality of delayed signals from said delaying means, respectively, and adding the weighted delayed signals; and switching means for inputting said delayed signals from said delaying means into said weighted adder means while said weighted adder means while said weighted adder means outputs and output signal having a correlation peak, meanwhile, otherwise, outputting a fixed value which provides no correlation in a correlated output signal to said weighted adder means instead of said delayed signals from said delaying means.

4. A correlating filter comprising:

delaying means for applying a delay process to an input signal and outputting a plurality of delayed signals having different delays;

weight adder means for weighting said plurality of delayed signals from said delaying means, respectively, and adding the weighted delayed signals; and switching means for inputting weighting coefficients from external into said weighted adder means while said weighted adder means outputs an output signal having a correlation peak, meanwhile, otherwise, outputting a fixed value which provides no correlation in a correlated output signal to said weighted adder means instead of said weighted coefficients.

5. The correlating filter according to claim 1, said correlating filter comprising a code division multiple access (CDMA) receiver, and further comprising decoding means for reproducing received data from an output signal of said correlating filter, wherein said decoding means is controlled by the operation control means of said correlating filter so as to be substantially stopped at the same timing as said weighted adder means of said correlating filter during a time period other than when said weighted adder means outputs an output signal having a correlation peak.

6. The correlating filter according to claim 2, said correlating filter comprising a code division multiple access (CDMA) receiver, and further comprising decoding means for reproducing received data from an output signal of said correlating filter, wherein said decoding means is controlled by the operation control means of said correlating filter so as to be operated at the same timing as said weighted adder means of said correlating filter during a time period when said weighted adder means outputs an output signal having a correlation peak.

7. The correlating filter according to claim 3, said correlating filter comprising a code division multiple access (CDMA) receiver, and further comprising decoding means for reproducing received data from an output signal of said correlating filter, wherein said decoding means is controlled based on a control signal produced at the switching means of said correlating filter so as to be operated at the same timing as said weighted adder means of said correlating filter during a time period when said weighted adder means outputs an output signal having a correlation peak.

8. The correlating filter according to claim 4, said correlating filter comprising a code division multiple access (CDMA) receiver, and further comprising decoding means for reproducing received data from an output signal of said correlating filter, wherein said decoding means is controlled based on a control signal produced at the switching means of said correlating filter so as to be operated at the same timing as said weighted adder means of said correlating filter during a time period when said weighted adder means outputs an output signal having a correlation peak.

9. The correlating filter according to claim 1, said correlating filter comprising of a code division multiple access (CDMA).

10. The correlating filter according to claim 2, said correlating filter comprising of a code division multiple access (CDMA).

11. The correlating filter according to claim 3, said correlating filter comprising of a code division multiple access (CDMA).

12. The correlating filter according to claim 4, said correlating filter comprising of a code division multiple access (CDMA).

* * * * *